(12) United States Patent
Rahim

(10) Patent No.: US 6,207,991 B1
(45) Date of Patent: *Mar. 27, 2001

(54) INTEGRATED NON-VOLATILE AND CMOS MEMORIES HAVING SUBSTANTIALLY THE SAME THICKNESS GATES AND METHODS OF FORMING THE SAME

(75) Inventor: Irfan Rahim, Milpitas, CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/045,269

(22) Filed: Mar. 20, 1998

(51) Int. Cl.[7] .................... H01L 29/792; H01L 21/8238; H01L 21/336
(52) U.S. Cl. .................. 257/326; 438/201; 438/211; 438/258
(58) Field of Search ............... 257/326; 438/201, 438/211, 258

(56) References Cited

U.S. PATENT DOCUMENTS

| | | | |
|---|---|---|---|
| 4,302,766 | * 11/1981 | Guterman et al. ............... | 438/258 |
| 5,047,358 | 9/1991 | Kosiak et al. ................... | 437/34 |
| 5,225,700 | 7/1993 | Smayling ......................... | 257/321 |
| 5,227,326 | * 7/1993 | Walker ............................ | 438/258 |
| 5,292,681 | 3/1994 | Lee et al. ........................ | 438/201 |
| 5,471,422 | 11/1995 | Chang et al. .................... | 365/185.26 |
| 5,500,392 | 3/1996 | Reynolds et al. ............... | 438/401 |
| 5,538,912 | 7/1996 | Kunori et al. ................... | 438/201 |
| 5,610,421 | * 3/1997 | Contiero et al. ................ | 257/321 |
| 5,637,520 | 6/1997 | Cappelletti et al. ............. | 438/258 |
| 5,656,522 | 8/1997 | Komori et al. .................. | 438/258 |
| 5,656,840 | 8/1997 | Yang ............................... | 257/316 |
| 5,773,862 | * 6/1998 | Peng et al. ...................... | 257/316 |
| 5,856,221 | 1/1999 | Clementi et al. ................ | 438/258 |
| 5,879,990 | 3/1999 | Dormans et al. ................ | 438/257 |
| 5,911,104 | 6/1999 | Smayling et al. ............... | 438/202 |
| 6,124,157 | * 9/2000 | Rahim ............................. | 438/201 |

OTHER PUBLICATIONS

Wei–Hua Liu et al., A 2–Transistor Source–Select (2TS) Flash EEPROM for 1.8v–Only Applications, pp. 1–3.

* cited by examiner

Primary Examiner—Olik Chaundhuri
Assistant Examiner—Howard Weiss
(74) Attorney, Agent, or Firm—Christopher P. Maiorana, P.C.

(57) ABSTRACT

A method of forming non-volatile memory (e.g., an EEPROM device) and a CMOS device (e.g., a RAM), on a single die or chip, and a structure formed by the method. In one embodiment, the control gate of the storage transistor as well as the isolation gate of the isolation transistor may be formed during the same manufacturing process step, and thus may be formed of the same gate poly material and may have similar thickness.

19 Claims, 9 Drawing Sheets

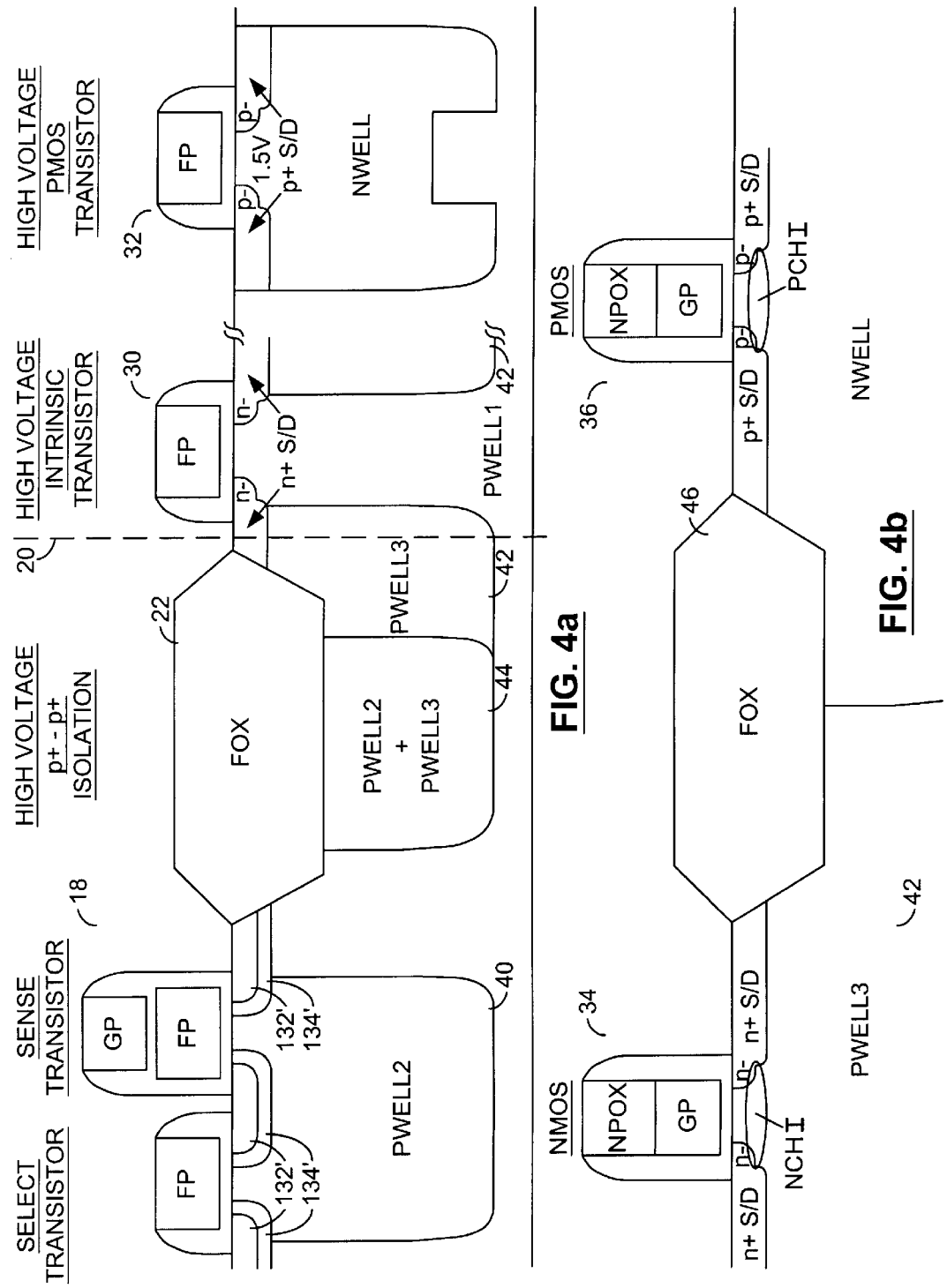

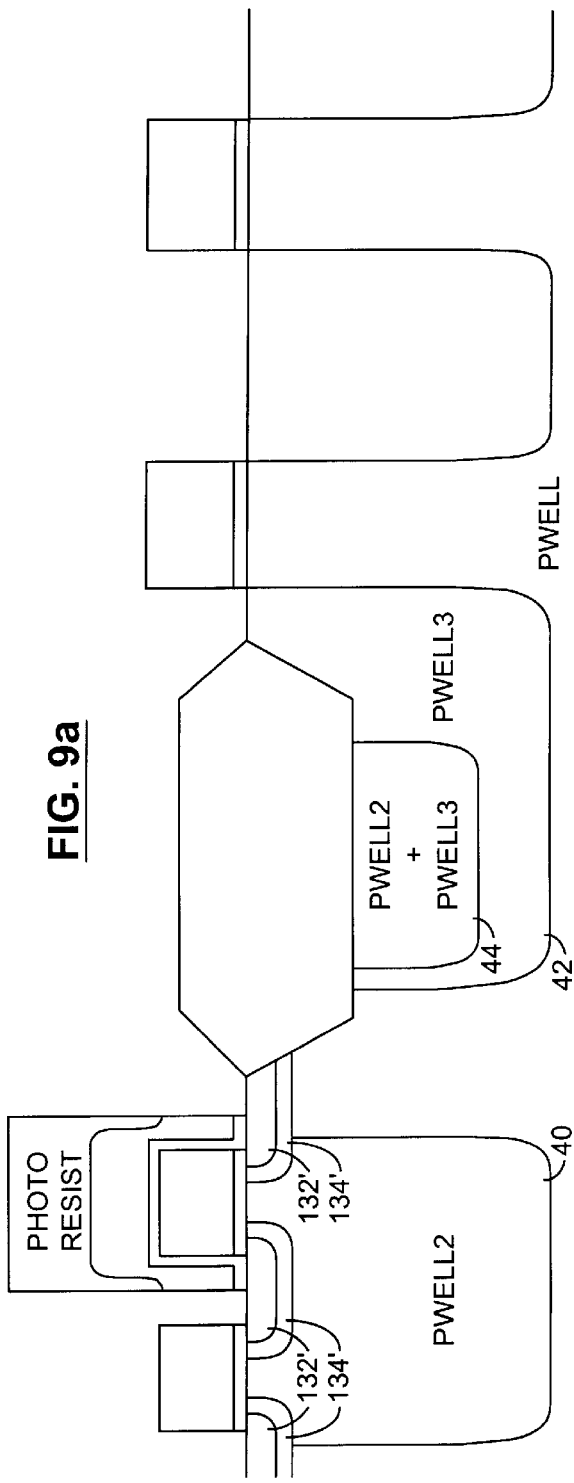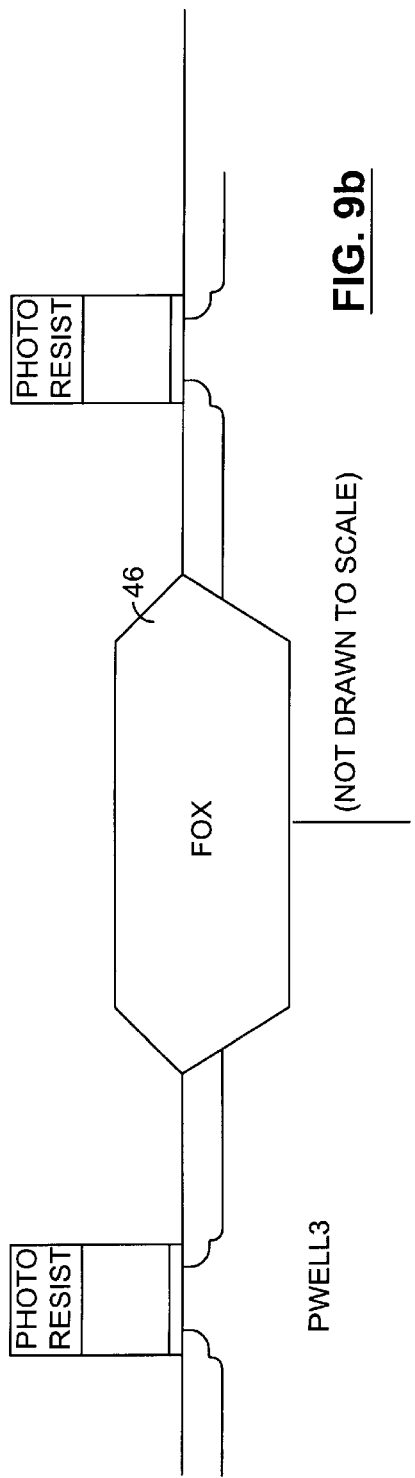

INTEGRATED NON-VOLATILE AND CMOS MEMORIES HAVING SUBSTANTIALLY THE SAME THICKNESS GATES AND METHODS OF FORMING THE SAME

FIELD OF THE INVENTION

The present invention relates to semiconductor memory devices generally, and more particularly, to methods and structures providing both non-volatile memory (such as an electrically erasable and programmable read-only memory or EEPROM) and CMOS circuity (such as a Random Access Memory or RAM) on a single integrated circuit.

BACKGROUND OF THE INVENTION

EEPROMs are non-volatile memory devices which are erased and programmed using electrical signals. In general, an EEPROM cell, such as a FLOTOX (floating gate-tunnel oxide) cell, includes a floating gate transistor and a select transistor. The select transistor generally selects which individual cells of the EEPROM device are erased and programmed at a particular time.

CMOS devices may be used to implement a variety of discrete logic components and other digital devices, such as various types of RAMS, microprocessors, shift registers, sense amplifiers, etc. Generally, however, many of the processing steps for making an EEPROM device differ from the processing steps for making CMOS devices.

Conventional approaches to forming both EEPROM devices and CMOS devices on a single die generally comprise forming the EEPROM devices while masking the area(s) for the CMOS devices, then masking the EEPROM devices and forming the CMOS devices separately, or vice versa. This approach requires a total number of steps generally equal to the steps required to form each device on separate dice. While some basic steps may be performed simultaneously, it is generally difficult to integrate the steps of the EEPROM and CMOS processes.

SUMMARY OF THE INVENTION

The present invention concerns a method of forming non-volatile memory (e.g., an EEPROM device) and a CMOS device (e.g., a RAM), on a single die or chip, and a structure formed by the method. In one embodiment, the control gate of the storage transistor as well as the gate of the select transistor may be formed during the same manufacturing process step, and thus may be formed of the same gate poly material and may have a similar thickness.

One aspect of the invention includes a two transistor EEPROM cell with source/drain junctions and channel implants formed independent (e.g., custom junctions) of CMOS source/drain junctions and channel implants. Another aspect of the invention includes forming a channel stop structure and a tunnel oxide with a high voltage gate oxide using a single photolithographic step. Yet another aspect of the present invention includes a structure comprising (i) a two transistor EEPROM cell, and (ii) an NMOS transistor select transistor. Such a structure can be made by the present method with the addition of three photolithographic steps to a conventional CMOS process.

Another aspect of the invention includes a two transistor EEPROM cell having a high voltage intrinsic transistor, a high voltage PMOS transistor and a high voltage NMOS transistor with independently formed (i.e., separate from the CMOS junctions) junctions, while using only three additional photo steps.

The objects, features and advantages of the present invention include a method providing a non-volatile memory device and a CMOS device on a single integrated circuit while combining similar steps of each process, and a single-chip structure comprising a non-volatile memory device structure and a CMOS device structure made by such a method. The present invention may provide the combination of processes without significantly interrupting the flow of either process (e.g., the EEPROM process or the SRAM/CMOS process).

BRIEF DESCRIPTION OF THE DRAWINGS

These and other objects, features and advantages of the present invention will be apparent from the following detailed description and the appended claims and drawings in which:

FIG. 4A is a cross-sectional diagram across the arrow A–A' of FIG. 1 (high voltage transistor not shown in FIG. 1), and FIG. 4B is a cross-sectional diagram of the CMOS transistors according to the present invention;

FIGS. 9A and 9B illustrate a cross-sectional diagram of an alternate implementation to the EEPROM memory cell (FIG. 9A) and the CMOS device (FIG. 9B) after an intermediate step in the present method.

DETAILED DESCRIPTION OF THE PREFERRED EMBODIMENTS

Figure 1:
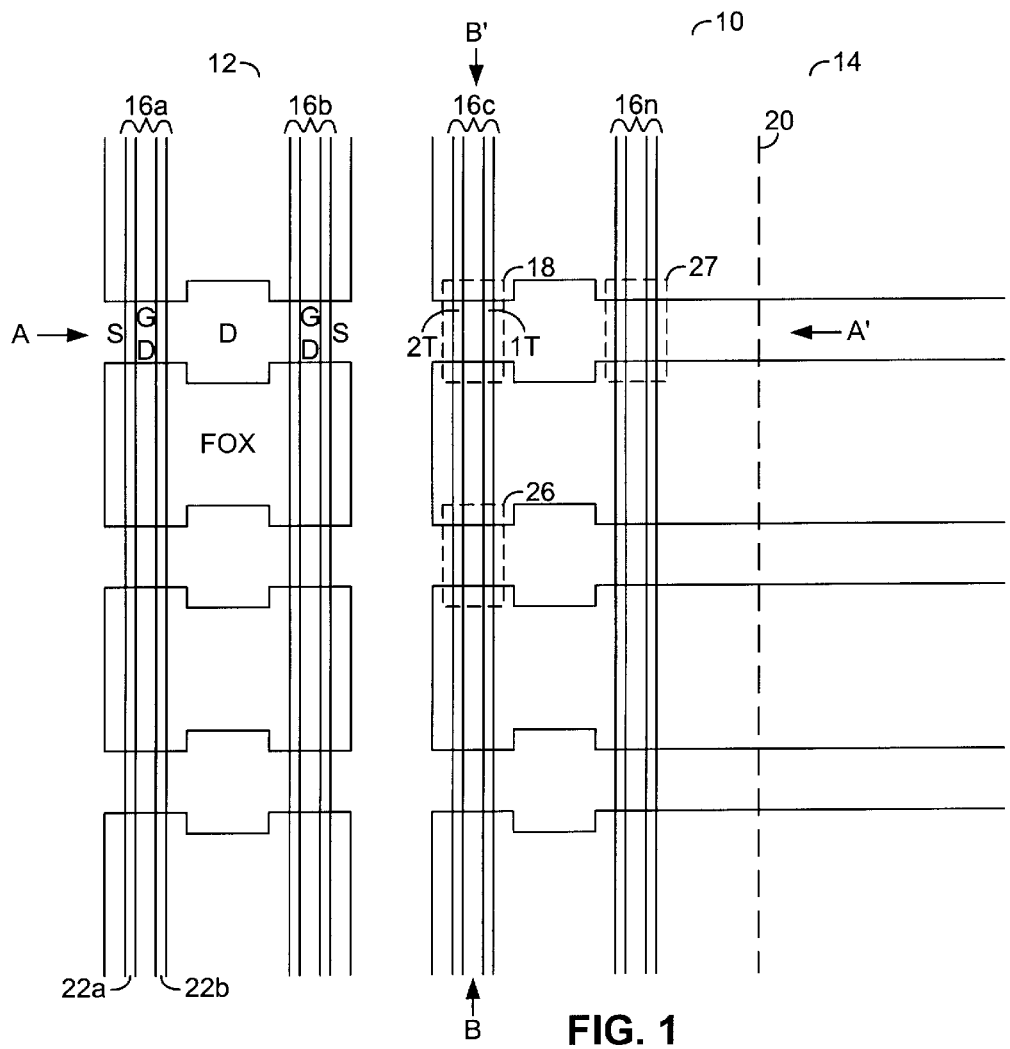
FIG. 1 is a top view of a preferred embodiment of the present invention illustrating the separation between a CMOS structure and an EEPROM structure.

FIG. 1 shows a top view of transistors formed in a non-volatile portion of an integrated circuit 10 in accordance with a preferred embodiment of the present invention. The integrated circuit 10 generally comprises a non-volatile portion 12, a CMOS portion 14 (transistors therein not shown) and a high voltage circuit portion (not shown). The non-volatile portion 12 generally comprises a number of load lines 16a–16n that each generally comprise a load line 22a and a load line 22b. A fundamental non-volatile memory cell 18 is shown comprising a transistor 1T and a transistor 2T. The transistor 2T may be manufactured in accordance with the process (to be described in more detail in connection with FIGS. 4–9) for making transistors in the CMOS section 14. A first portion of the transistor 1T may be manufactured in accordance with the process of the non-volatile portion 12.

A junction 20 generally illustrates a transition or boundary between the non-volatile portion 12 and the CMOS portion 14 of the die. By forming the transistor 2T in accordance with the process for forming the CMOS portion 14, the overall processing steps in manufacturing the memory cell 18 may be reduced. In addition, since the CMOS portion of the present process is used to manufacture the transistor 2T, additional transistors in the CMOS portion 14 may be manufactured without or with a minimum of additional processing steps. Cross-section indication arrows A and B are illustrated to more clearly define the structures shown in FIGS. 2–8.

Figure 2:
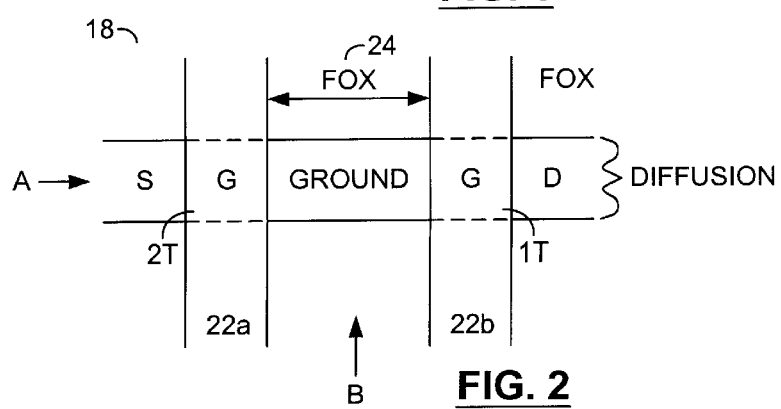
FIG. 2 is a top view of a non-volatile memory cell shown in FIG. 1 in accordance with a preferred embodiment of the present invention.

Referring to FIG. 2, a more detailed top view of the memory cell 18 is shown. The load line 22a forms the gate of the transistor 2T, while the load line 22b forms the gate of the transistor 1T. The field oxide layer of structure 24 generally forms an isolation region or structure between neighboring cells in the non-volatile portion of the integrated circuit (e.g., 18 and 26 of FIG. 1). In general, no significant current should flow through or around the field oxide structure 24. The isolation properties of and the method for forming the field oxide 24 will be described in more detail in connection with FIGS. 4–8.

Figure 3:
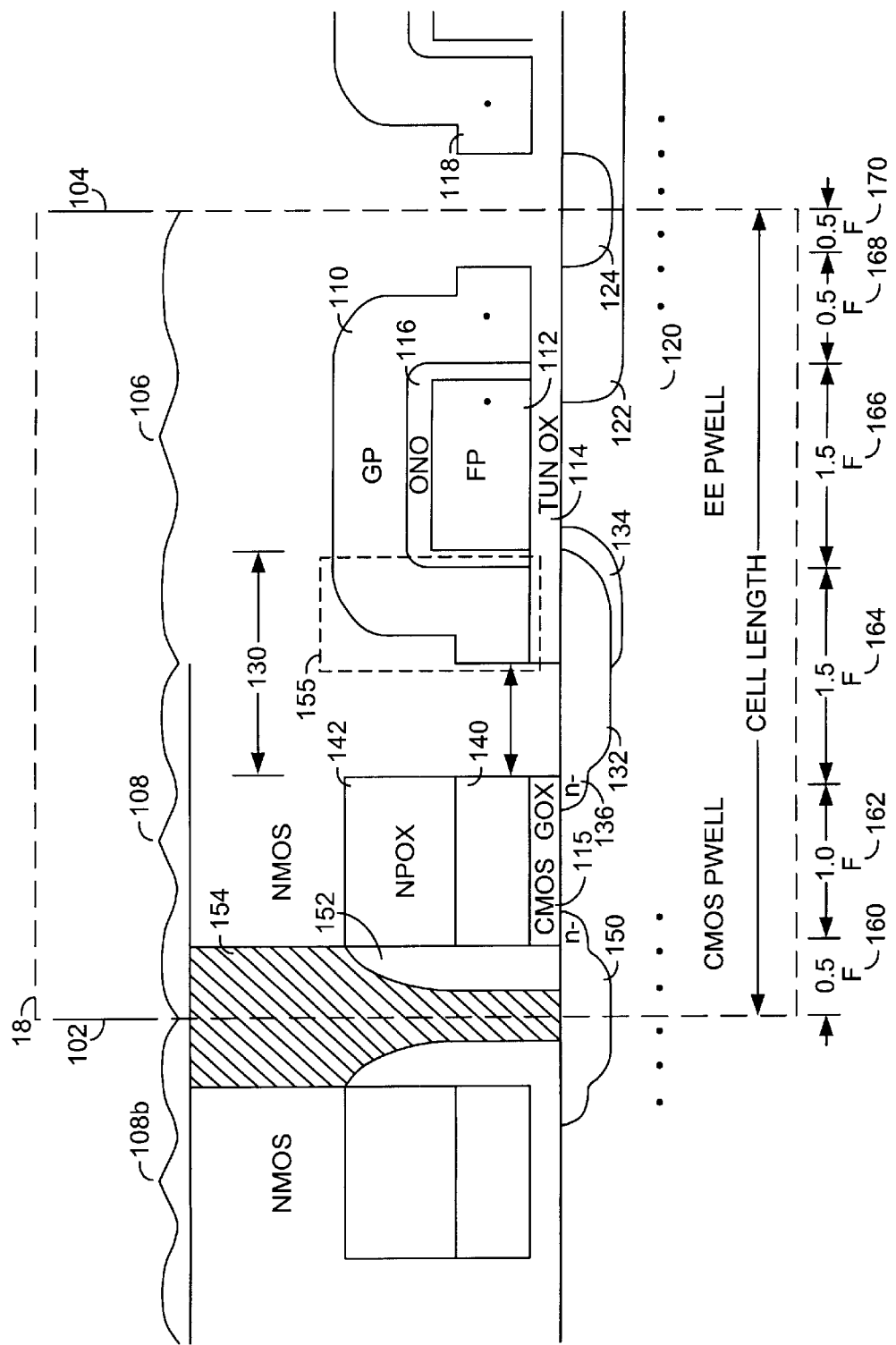
FIG. 3 is a cross-section of a non-volatile memory cell in accordance with a preferred embodiment of the present invention.

Referring to FIG. 3, a cross-sectional view of the memory cell 18 is shown in accordance with a preferred embodiment of the present invention. The memory cell 18 is shown generally reflected about an axis or plane 102 (for two-cell units) and an axis or plane 104 (for one-cell units) either or both of which may provide a repetitive pattern across the non-volatile portion of the die.

The memory cell 18 generally comprises a storage transistor 106 and a select transistor 108. The storage transistor 106 generally comprises a control gate 110 and a floating gate 112. The floating gate 112 is formed over a tunnel oxide layer 114. A dielectric layer 116 (preferably comprises a conventional oxide/nitride oxide layered structure or "ONO") may be formed over and around the vertical side walls of the floating gate 112 (i.e., between the floating gate 112 and control gate 110). The control gate 110 may be formed over the floating gate 112, but separated by the dielectric layer 116. A drain region 120 is generally formed which may have a moderately doped region 122 overlapping the floating gate 112 and control gate at their interface across the tunnel oxide 114, and a heavily doped region 124 that may be self-aligned with the sidewalls of the control gates 110 and 118. The doped region 120 is generally doped with phosphorous (P), while the heavily doped region is generally doped with both phosphorous and arsenic (As).

A buried implant (or transition) region 130 is shown between the storage transistor 106 and the select transistor 108. The transition region 130 generally comprises an arsenic doped region 132 and a phosphorous doped region 134. The arsenic doped region 132 and the phosphorous doped region 134 are generally functionally distinct from the regions 122 and 124, but may be formed during the same processing step and may be self-aligned to the gate poly sidewalls. A lightly doped diffusion (LDD) region 136 is conventional and may be formed by known techniques (see for example, U.S. Pat. Nos. 4,566,175; 4,878,100; 5,326,999; 5,373,170; 5,545,581 and 5,518,945, the relevant portions of which are each hereby incorporated herein by reference).

The select transistor 108 generally comprises a select gate 140 (generally formed at the same time and from the same material as either the floating gate or the control gate) as well as an oxide layer 142. The oxide layer 142 may comprise $SiO_2$, $SiO_2$ doped with phosphorous or boron, or a similar dielectric material. The select gate 140 is generally formed over a conventional CMOS gate oxide layer 115. A source region 150 is generally formed by implanting a conventional amount of a dopant (such as phosphorous (P) or preferably arsenic (As)) into the semiconductor substrate. A sidewall spacer 152 may be formed by known techniques over the source region 150, adjacent to the gate 140. A contact 154 may be formed by known techniques between transistor 108 which may allow the select transistor of the adjacent cell (108b) to electrical connect the source region 150 to a metal bus line overlying cell 18 (not shown). The contact 154 may be formed by conventional self-aligned techniques (see e.g., U.S. Pat. No. 4,892,835; 5,385,634; 5,166,771; 5,258,096; 5,219,784; and 5,471,422; and Lee et al., "A process Technology for 1 Giga-Bit DRAM", IEDM 95-907 (1995), pp. 36.2.1–36.2.4, the relevant portion(s) of which are incorporated herein by reference), which may allow positioning the individual memory cells, for example 18 and 27, closer together. As a result, the overall density of the integrated circuit 10 may be increased. The regions 132, 134 and 136 generally contain one or more dopants in concentration's sufficient for proper functioning of the cell 18.

The select gate 140 may be formed from the same processing step(s) as, and may have a thickness the same as, or similar to, either the floating gate 112 or the control gate 110. Similarly, the tunnel oxide region 114 may have a substantially uniform thickness under the floating gate 112 and may have the same or similar thickness as the gate oxide layer under select gate 140. Preferably however, tunnel oxide layer 114 has a thickness smaller than that of the oxide layer between the select gate and the substrate surface.

The distances 160, 162, 164, 166, 168 and 170 shown below the memory cell 18 generally represent exemplary relative distances of the particular regions of the memory cell 18. For example, the distance 160 represents the distance between the center of source region 150 (i.e., along the axis 102) and the nearest sidewall of select gate 140 and may be small as 0.5F. The actual length corresponding to "F" is represented by a critical dimension of the cell (i.e., a dimension in a particular structure, such as a transistor gate length, the spacing between gates or between a gate and a contact, etc. beyond which it cannot shrink without introducing potentially fatal sources of misalignment error [e.g., for a transistor having a gate length of 0.25 $\mu$m, F=0.25 $\mu$m]). The distance 164 generally corresponds to source region 130 and may be represented by the distance between the right sidewall of the select gate 140 and the left sidewall of the floating gate 112. The distance 164 may be from 1.0 to 2.0F, preferably about 1.5F. A portion 155 of the control gate to optimize the capacitive overlap between the control gate and floating gate without dramatically increasing the cell size 110 may be formed over the source 130 to enhance capacitive overlap between these structures. The distance 166, which generally represents the length of the floating gate 112, may be from 1.0 to 2.0F, preferably about 1.5F. The distance 168 generally represents the portion of the gate 110 that overlaps with no directly-doped drain implant region 122, up to the self-aligned, heavily-doped region 124 and may be from 0.2–0.7F, preferably about 0.5F. The distance 170 generally represents one-half the width of the heavily-doped drain region 124 (from the control gate sidewall to the axis 104) and may be from 0.3 to 0.7F, preferably about 0.5F.

The tunnel oxide layer 114 may be formed by conventional oxide growth or deposition techniques (preferably by thermal growth) prior to forming the floating gate 112 and the control gate 110. Since the control gate 110 may be formed during the later steps of the formation of the storage transistor 106, and the gate poly region 140 may be formed during the early steps of the CMOS process needed to form the select transistor 108, the steps in forming the transistors 106 and 108 may be performed in a non-repetitive and generally cumulative matter. Specifically, the need to mask one or two regions (e.g, the non-volatile, high voltage and/or CMOS region(s) during the steps forming another region may be reduced or eliminated.

The memory cell 18 is generally a two transistor EEPROM cell that may contain fully customized source and drain junctions as well as channel doping (e.g., with regard to the specie(s), dose, energy and annealing conditions) that can be formed with the addition of three photolithographic steps to a conventional CMOS process. A photolithographic mask may protect the non-volatile memory section 12 during formation of transistors in the CMOS section 14 (or vice versa), and may protect the entire chip while implanting the CMOS PWELL. During the CMOS blanket implant, the channel region(s) of the transistor 1T may be masked with the floating gate polysilicon layer, and may provide a one photo step compatibility with conventional EEPROM cells. A 20% drop in total die cost for a 60% increase in the non-volatile memory cell area may result. The aspects of the memory cell 18 will become more apparent in connection with FIGS. 4–8.

The memory cell 18 may operate in accordance with the operation parameters in the following TABLE 1:

TABLE 1

| OPERATION | VOLTAGE APPLIED | | | |
|---|---|---|---|---|
| | SOURCE | SELECT GATE | CONTROL GATE | DRAIN |
| PROGRAM | 0 | 0 | 8 | 6 |
| ERASE | 0 | 0 | −10 | 5 |
| READ | 0 | Vcc | Vcc (0) | 1 |

Alternately, the memory cell 18 may be operated in accordance with the operational parameters in the following TABLE 2:

TABLE 2

| OPERATION | VOLTAGE APPLIED | | | |
|---|---|---|---|---|
| | SOURCE | SELECT GATE | CONTROL GATE | DRAIN |
| PROGRAM | 0 | 0 | −10 | 6 |
| ERASE | 0 | 0 | 12 | 0 |
| READ | 0 | Vcc | 0–2 | 1 |

In programming the memory cell 18, the source region and the select transistor 108 are generally grounded. Alternatively, the source may be electrically floating. A positive voltage between approximately 2 to 10 volts, and preferably 5 to 8 volts, may be applied to the control gate 110. A positive voltage of between approximately 2 to 10 volts, and preferably 5 to 7 volts may be applied to the cell drain 122. The selection of the applied voltages is generally based on the junction breakdown voltage at the drain junction. The drain voltage is typically set at about 0.5 volts below the junction breakdown voltage. One suitable voltage combination for programming is applying 8 volts to the control gate 110 and 6 volts to the drain.

During a programming operation, the drain junction depletion region is generally kept in a weak junction avalanche state to supply electrons to the floating gate 112. As a result, the programming current may be less than 1 nA when the control gate voltage is either about 5 volts or 9 volts. The low programming current may be achieved due to higher electron injection efficiency (and thus lower programming power consumption) and less heat generation during programming may result. A programming time of from approximately 1 to 100 µs may be selected, dependent on design criteria. In general, hot injection programming times are faster than Fowler-Nordheim tunneling programming speeds. As a result, the memory cell 18 of the present invention may provide programming speeds comparable to, or faster than, many other conventional EEPROM cells.

The memory cell 18 may be erased by Fowler-Nordheim tunneling specifically, or grounding the memory cell source and the gate, source or drain of the select transistor 108 and applying a negative voltage of between approximately −5 to −20 volts, preferably −8 to −12 volts, to the control gate 110 and applying a positive voltage of between approximately 0 to 5 volts, preferably 4 to 5 volts, to the cell drain 122. One suitable voltage combination for erasing the memory cell 18 is to apply −10 volts on the control gate 110 and +5 volts on the cell drain 122, all other cell electrodes being grounded. A high electric field may be created across the tunnel oxide by the voltages on the drain of the storage transistor 106 and the control gate. As a result, electrons may be tunneling from the control gate to the drain of the storage transistor 106. The source of the storage transistor 106 may be electrically floating as a result of grounding the select transistor 108.

The memory cell 18 may be erased read using conventional techniques. For example, a voltage equal to the power supply (Vcc) may be applied to the isolation gate. The control gate may be either grounded or coupled to the power supply voltage. A voltage of about 1 volt may be applied to the drain. As a result, the memory cell 18 may tolerate over-erasure, which is desirable.

The following TABLE 3 illustrates an exemplary sample of the essential steps in the non-volatile process:

TABLE 3

| Photo | Etch | Implant |
|---|---|---|
| Tunnel Oxide Mask | Gate Oxide Mask | pwell2 |
| Storage Gate Mask | Cell Gate | Cell S/D |
| NV Array Protect Mask | HV Gate | CMOS pwell |

The following TABLE 4 illustrates a summary of the additional unmasked steps:

TABLE 4

| | Unmasked Additional Step |
|---|---|
| 1 | GOX1 |
| 2 | Oxidation (FP) |
| 3 | Nitride Deposition (FP) |
| 4 | Oxidation (FP) |
| 5 | PWELL for HV Transistors |

FIGS. 4A and 4B show a cross-sectional diagram of the layout of FIG. 1 along the A–A' axis. The memory cell 18 is shown positioned adjacent to a field oxide structure 22.

The junction 20 is shown in FIG. 4A between the non-volatile portion 12 and a high-voltage portion (comprising transistors useful in high-voltage programming circuitry). Alternatively, the high-voltage portion, which may comprise a high-voltage intrinsic transistor 30 and a high-voltage PMOS transistor 32, may be included in the non-volatile portion, or may be a portion of circuitry independent of both the non-volatile and CMOS portions. FIG. 4B shows the CMOS portion 14. The CMOS portion 14 generally comprises an NMOS transistor 34 and a PMOS transistor 36.

Figure 5A:
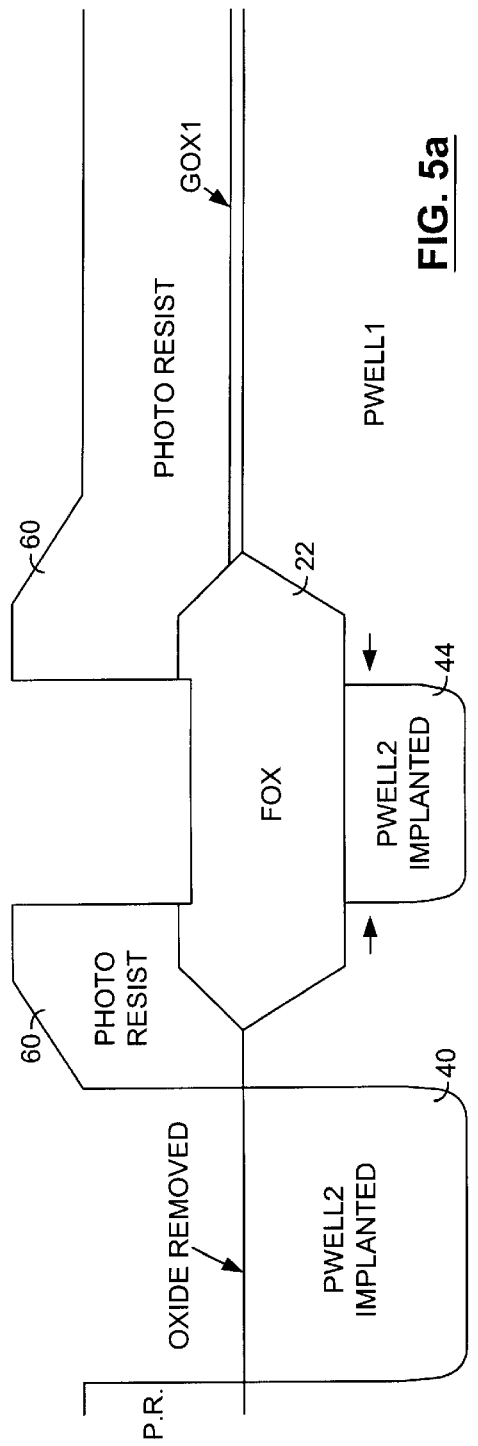
FIGS. 5A and 5B illustrate a cross-sectional diagram of a precursor to the EEPROM memory cell (FIG. 5A) and the CMOS device (FIG. 5B) after an intermediate step in the present method.
Figure 5B:
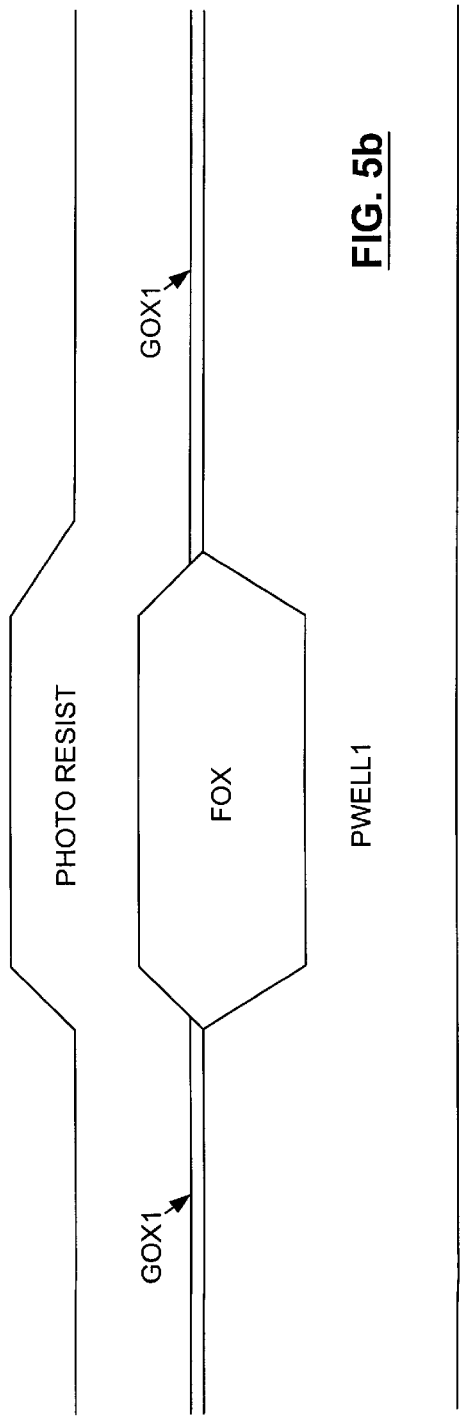
Figures 6A, 6B:
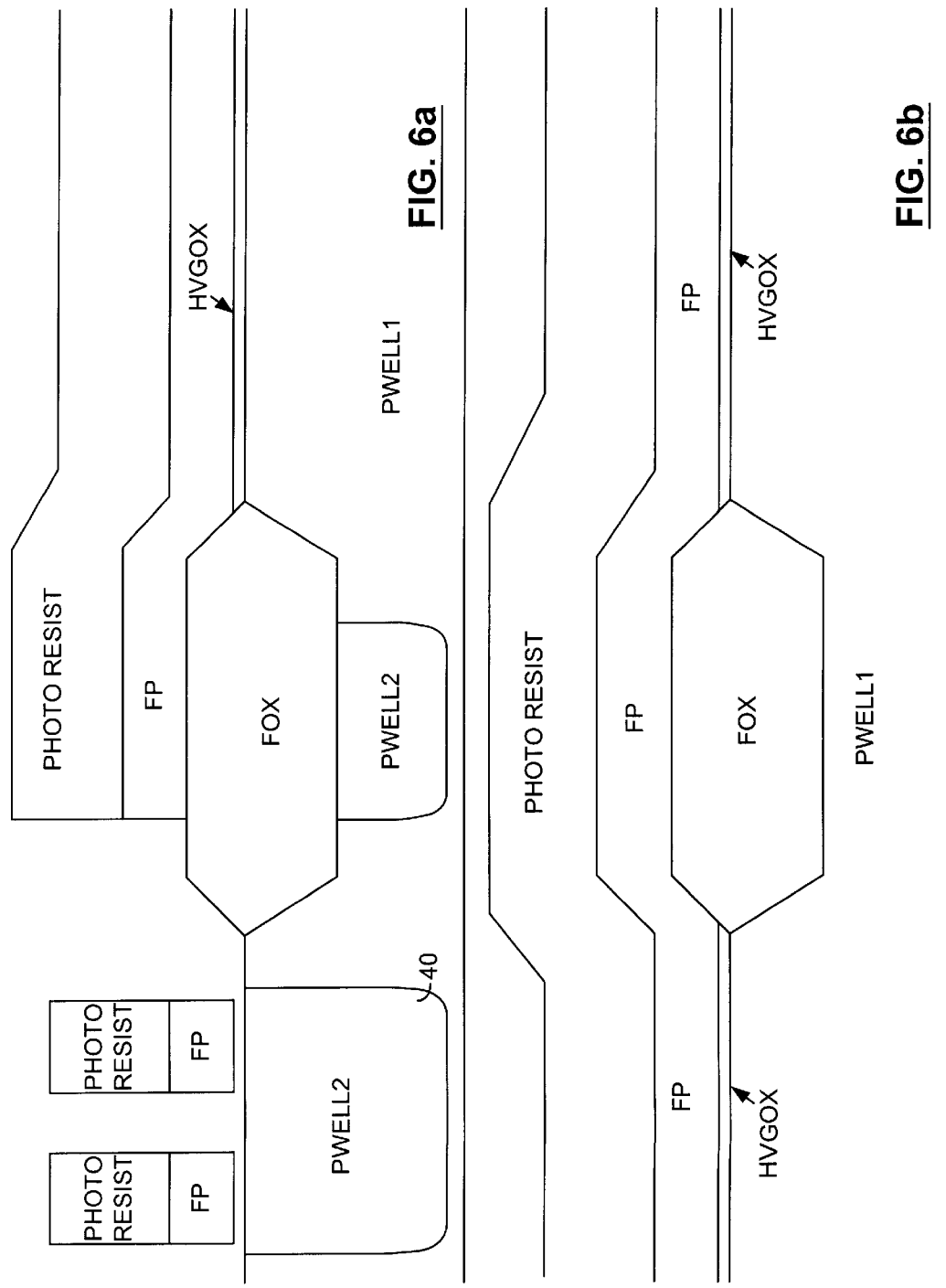
FIGS. 6A and 6B are a cross-sectional diagram of the memory cell and device of FIGS. 5A and 5B after a subsequent source-drain intermediate step in the present process.

As shown in FIG. 5, in the integrated process for forming both non-volatile and CMOS transistors starting with a p-doped substrate having field oxide structures and a gate oxide layer (e.g., G0X1) formed thereon, a photoresist mask is developed, such that a pwell implant (e.g., PWELL2) may be performed in the areas correspond to the 2T EEPROM memory cell 18 and field oxide 22. P well implants 40 and 44 for non-volatile transistors and/or high-voltage transistors (see high-voltage transistor 30 in FIG. 4a) may be performed in accordance with known methods and conditions, using known dopants in known concentrations. The exposed field oxide is then etched roughly to a depth corresponding to the thickness of the non-volatile transistor tunnel oxide.

Thereafter, the photoresist is removed and a tunnel oxide is grown in the exposed area of silicon into which the p well was implanted. At the same time, silicon oxide may grow in the etched region of the field oxide. The tunnel oxide may be from 50 to 150 Å thick, preferably 70–125 Å thick, more preferably 75–100 Å thick. In one embodiment, the tunnel oxide is about 85 Å thick.

A layer of gate material for forming the floating gate of the non-volatile storage transistor (e.g., silicon which may be doped with one or more conventional dopants, but which is preferably conventional polycrystalline silicon, or "poly") is deposited to a thickness of from 1000 to 5000 Å, preferably 1500–3500 Å, more preferably 1750–2750 Å. A photoresist (e.g., a "floating poly mask") is deposited thereon, then patterned and developed to expose the regions of silicon to be removed (preferably by conventional etching), thereby forming the floating gate of the storage transistor and the gate of the select transistor, and resulting in the structure shown in FIG. 6.

Figure 7A:
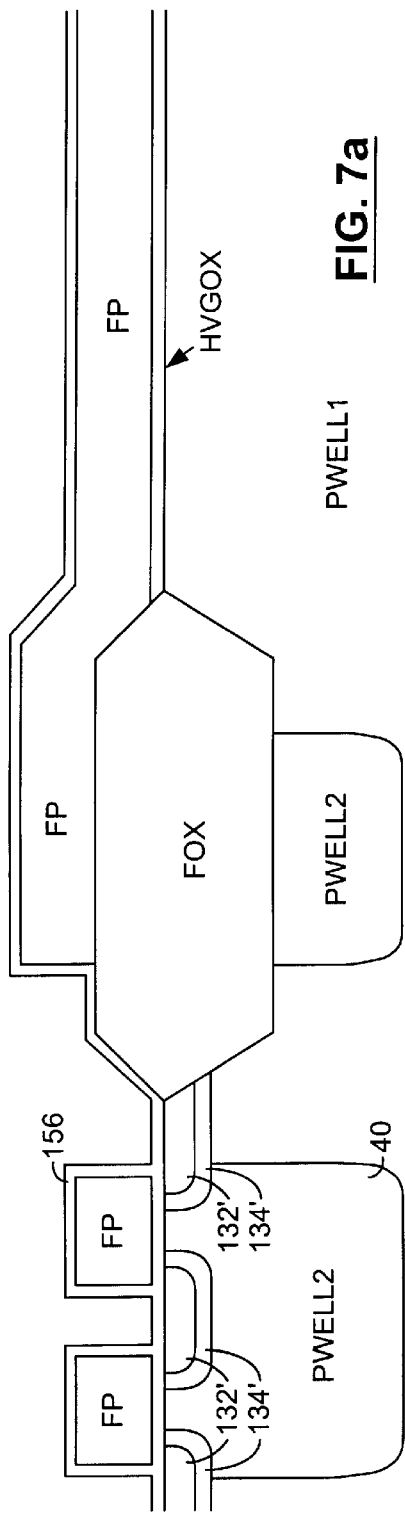
FIGS. 7A and 7B are a cross-sectional diagram of the structure of FIGS. 6A and 6B after source-drain implanting and subsequent formation of a dielectric layer over the array.
Figure 7B:
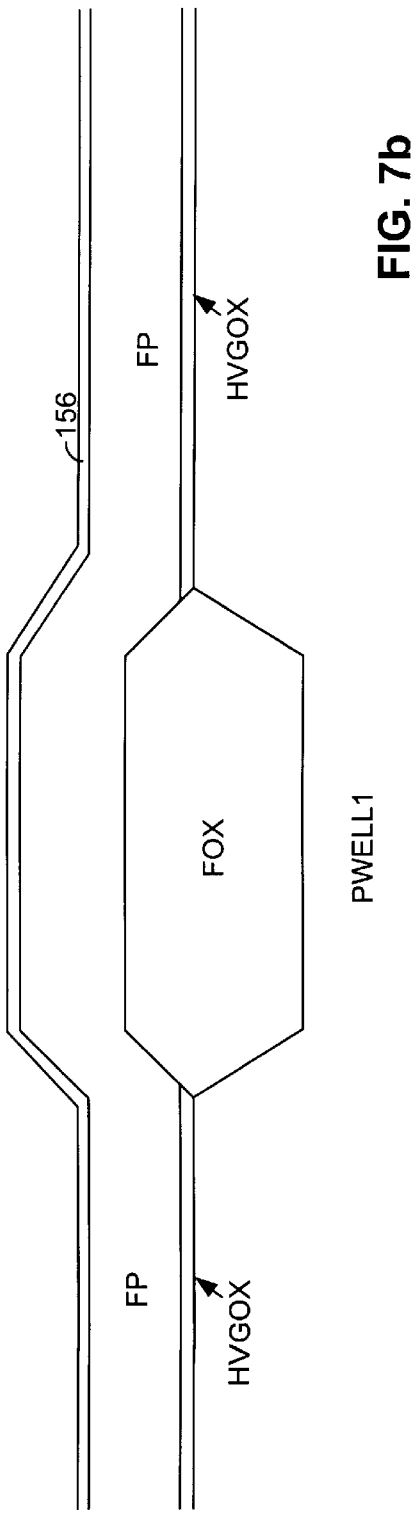

Thereafter, source/drain implants may be formed in the exposed regions of the substrate (see 132' and 134' in FIG. 7). Such non-volatile transistor implants may be performed in accordance with known methods and conditions, using known dopants in known concentrations. For example, such an implant may be formed by first implanting phosphorous (P) in a concentration and to a depth sufficient to provide desired and/or functional source and drain characteristics and properties for non-volatile memory storage and non-volatile select transistors, then implanting arsenic (As) in a concentration and to a depth sufficient to provide desired and/or functional ohmic contact with an electrical conductor coming into contact therewith (e.g., a contact or via linking the source/drain to an overlying interconnect or metal bus line). The first and second implants may be annealed separately or simultaneously to provide a desired depth and concentration profile. The second implant (e.g., As) is typically performed to a shallower depth than that of the first implant. Thereafter, the photoresist is removed and a conventional ONO layer 156 (e.g., a layered silicon oxide-silicon nitride-silicon oxide structure) is grown and/or deposited over the exposed areas, resulting in the structure shown in FIG. 7.

A photoresist is then deposited and developed to simultaneously (i) protect the non-volatile region of the chip or array and (ii) expose regions of silicon to be removed in forming gates of the high-voltage transistors. After removing exposed regions of the ONO and silicon (preferably by etching), a further implant (preferably of phosphorous; e.g., PWELL3) forms the channel implant of the CMOS transistors.

Figure 8A:
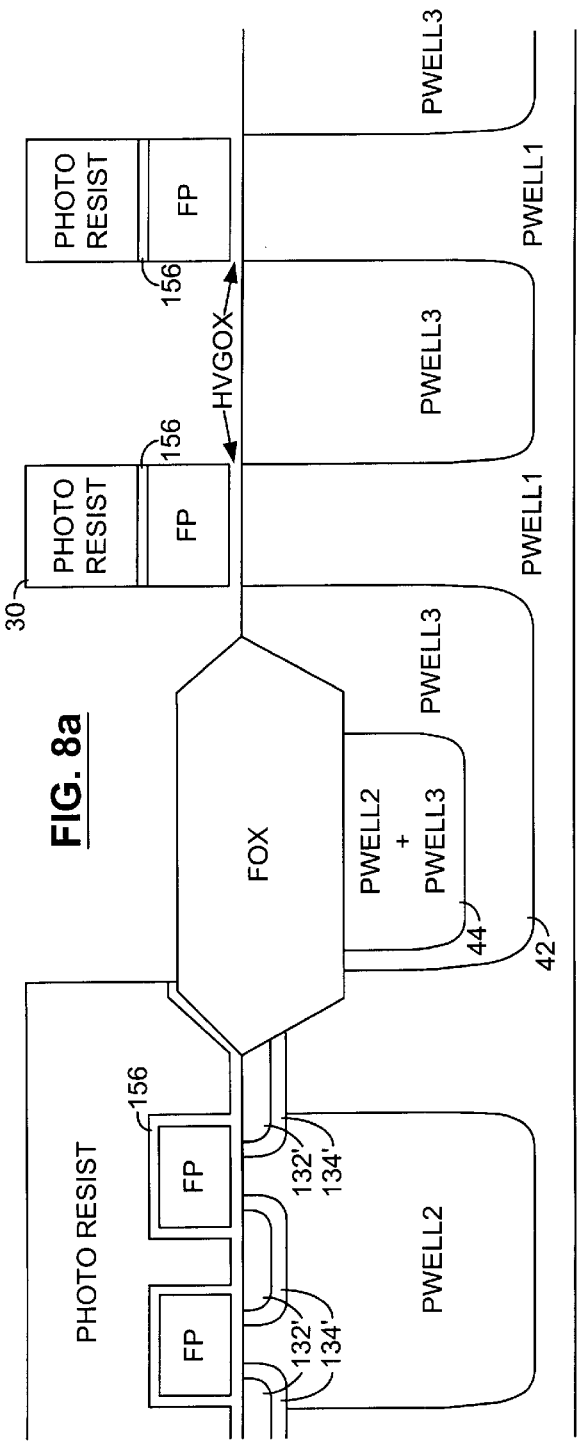
FIGS. 8A and 8B are a cross-sectional diagram of the structure of FIGS. 7A and 7B after forming a patterned photo resist layer step and subsequent etching and implanting.
Figure 8B:
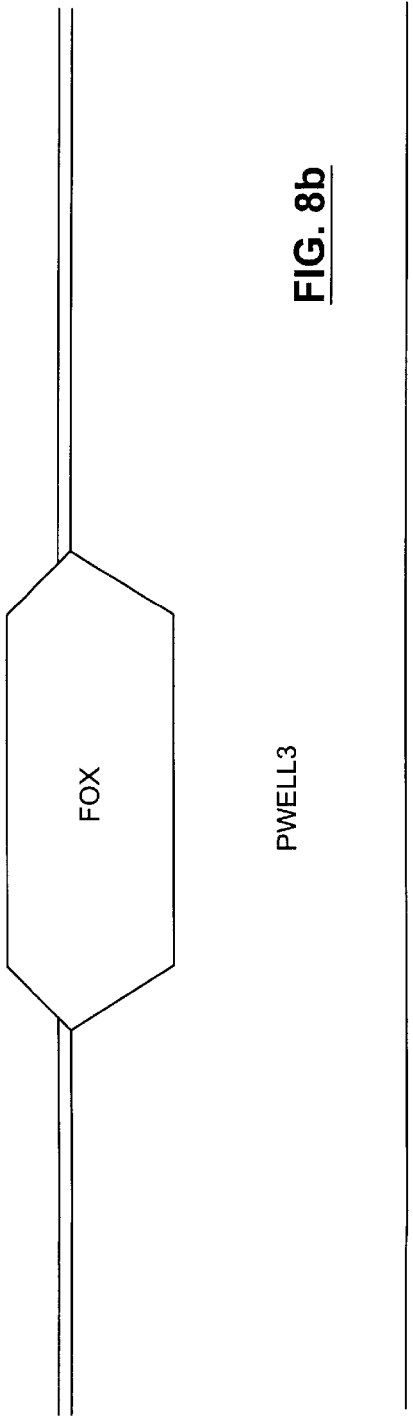

Thereafter, standard CMOS processing forms the remainder of the transistor features. The exposed high voltage gate oxide is removed (preferably by wet etching), and a CMOS gate oxide layer is formed (preferably by depositing or thermally growing the CMOS gate oxide, more preferably by conventional thermal growth in a wet or dry oxidizing atmosphere), resulting in the structure shown in FIG. 8. In this embodiment, the CMOS gate oxide layer has a thickness less than that of the layer, preferably less than 0.65 times that of the high-voltage gate oxide layer, and more preferably less than half that of the high-voltage gate oxide layer. In a more specific embodiment, the CMOS gate oxide layer has a thickness of not more than 90 Å (preferably not more than 70 Å), and the high-voltage gate oxide layer has a thickness of not more than 250 Å (preferably not more than 225 Å). As shown in FIG. 8, the implant 42 of the intrinsic high-voltage transistor 30 may overlap with, and possibly completely surround, the implant 44 shown in FIG. 5.

Thereafter, the photoresist is removed, and a layer of gate material for forming the control gate of the non-volatile storage transistor (e.g., silicon which may be doped with one or more conventional dopants, but which is preferably conventional polycrystalline silicon, or "poly") is deposited to an independent thickness of from 1000 to 5000 Å, preferably 1500–3500 Å, more preferably 1750–2750 Å, over the array. A photoresist (e.g., a "poly mask") is deposited thereon, then patterned and developed to expose the regions of silicon to be removed (preferably by conventional etching), thereby forming the control gate of the storage transistor and the gates of the CMOS transistors, and resulting in the structure shown in FIG. 9.

Further implants may then be made (e.g., source and drain implants [e.g., "n+ s/d" and "p+ s/d" regions in the substrate adjacent to the gates of the high-voltage and/or CMOS transistors in FIG. 4], lightly-doped source and/or drain extensions [e.g., "n−" and/or "p−" regions in the substrate adjacent to and/or below the gates of the non-volatile select, high-voltage and/or CMOS transistors], etc.) in accordance with known procedures. Such implants (e.g., bulk source/drain implants) may be self-aligned with the corresponding gate sidewalls, and may be made before or after the control gate is formed.

A protective dielectric layer may then be formed over the CMOS transistor gates. The protective electric layer may comprises silicon dioxide, silicon oxynitride or silicon nitride, which may be further doped with a conventional dopant such as boron (B) and/or phosphorous (P). For gates having a width of $\leq 0.25$ µm, the protective dielectric layer preferably comprises silicon nitride.

Sidewall spacers may be formed adjacent to any or all of the non-volatile select transistor gate, the combined control gate and floating gate of the non-volatile storage transistor, the high-voltage transistor gates and the CMOS transistor gates. The sidewall spacers may comprise silicon dioxide, silicon oxynitride or silicon nitride, which may be further doped with a conventional dopant such as boron (B) and/or phosphorous (P). For gates having a width of $\leq 0.25$ µm, the sidewall spacers preferably comprise silicon nitride. The sidewall spacers for may be formed simultaneously (i.e., for all transistors), independently (i.e., for each transistor) or in any combination thereof, (e.g., first for the storage transistor, then separately, for all transistors but the storage transistor; first for the non-volatile transistors, then separately, for the remaining transistors; either of these processes in the reverse order; separately for the non-volatile transistors, the high-voltage transistors, and the CMOS transistors; etc).

Thereafter, all photoresist materials may be removed, and a bulk dielectric layer (e.g., silicon dioxide, silicon oxynitride and/or silicon nitride, any of which may be further doped with a conventional dopant such as boron [B] and/or phosphorous [P], combinations thereof such as an undoped silica glass [USG]/doped silica glass [e.g., BSG, PSG or BPSG]/USG trilayer structure, etc.) may be deposited over the array. Contacts (which may be self-aligned) may then be formed in the dielectric layer in accordance with known procedures to provide electrical connectivity between transistor structures and overlying interconnected and/or metal bus structures (e.g., a power supply bus such as Vcc, Vpp [programming voltage, typically a voltage at least 1.5–3.0 times greater than Vcc] or ground; an output, control input, or bitline in a memory device; a so-called "piggyback" wordline; etc.). Local interconnects and/or metal bus lines may then be formed in (e.g., by a damascene-type process) or on (e.g., by more conventional technology) the dielectric layer in accordance with known procedures, to provide electrical connectivity between the contacts and the transistor structures connected thereto.

Optionally, if the high-voltage and CMOS transistors have a gate oxide layer with about the same thickness, many CMOS transistor structures may be formed at the same time as corresponding high-voltage transistor structures. For example, source and drain implants, lightly-doped source and/or drain extensions, sidewall spacers and even protective dielectric layers can be formed simultaneously. If a material other than the high-voltage transistor gate material is used as a mask during the high-voltage transistor deep source/drain well-CMOS transistor channel implant step, the high-voltage transistor gates and CMOS transistor gates may be formed at the same time.

While the invention has been particularly shown and described with reference to the preferred embodiments thereof, it will be understood by those skilled in the art that various changes in form and details may be made without departing from the spirit and scope of the invention. For example, the conductivity types of the substrate n-doped and p-doped regions may be complementary to (i.e., the opposite of) those illustrated herein. Also, the storage transistor may include a floating gate and control gate which are self-aligned to one another. In addition, the invention is not limited to a particular memory application. A cell as described herein may be used with nearly any type of electrically programmable read-only memory (EPROM), including a flash EEPROM (wherein more than one memory cell may be erased during the same erase operation), and a EEPROM.

Figure 10:
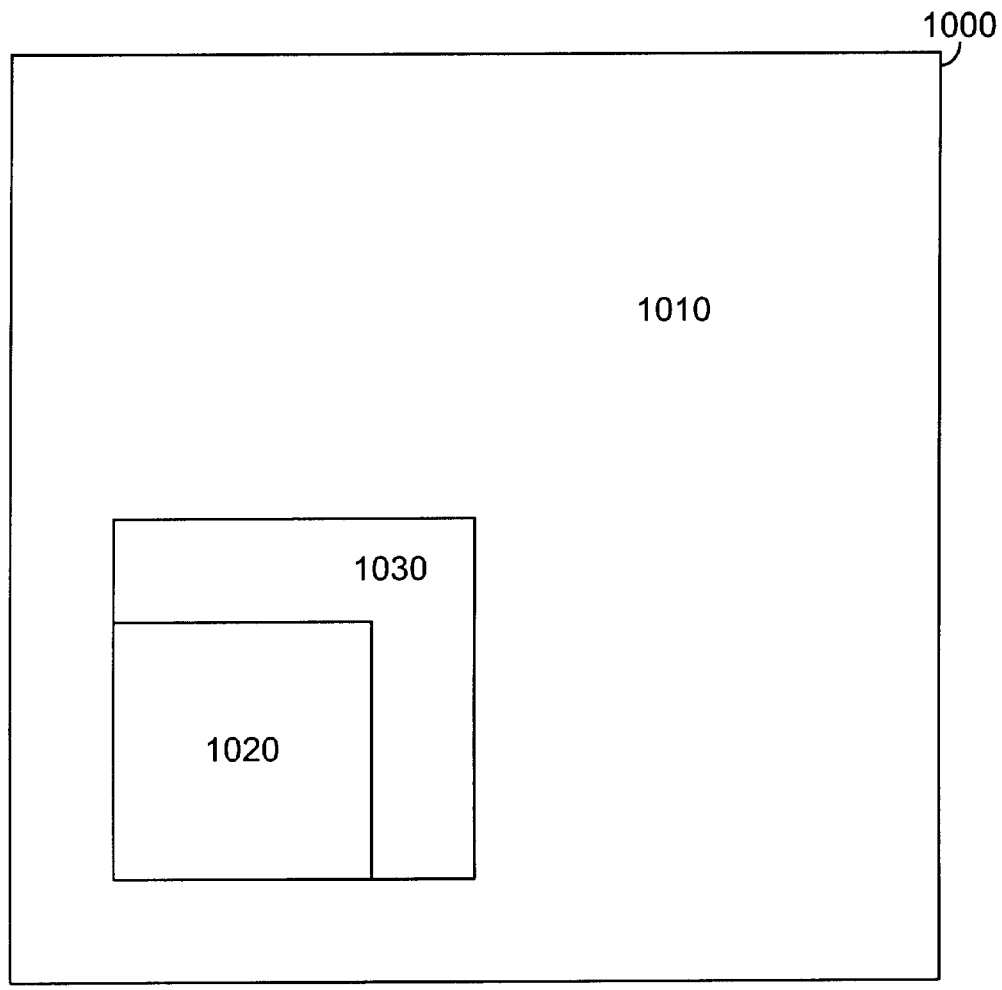
FIG. 10 shows an exemplary layout of a CMOS integrated circuit having an embedded non-volatile memory therein.

In a preferred application, the present method may be used to form an integrated circuit having all three types of transistors thereon (nonvolatile, high voltage, and CMOS, for example an integrated circuit providing a number of functions and meeting a number of predetermined performance criteria, particularly where such functions and criteria were previously obtainable only from a combination of integrated circuits (a so-called "system-on-a-chip" application). FIG. 10 shows an embodiment of an integrated circuit 1000 having a CMOS region 1010 (which may be, and preferably is, located on the periphery of the integrated circuit), a nonvolatile memory region 1020 (which may be, and preferably is, internal to the integrated circuit [i.e., located such that a CMOS region lies between the outermost border of the nonvolatile memory region and the outermost border of the integrated circuit), and a high voltage region 1030 (which may be, and preferably is, internal to the integrated circuit and located immediately adjacent to one or more outermost borders of a nonvolatile memory region). The integrated circuit may, however, comprise more than one continuous or discrete CMOS regions, more than one continuous or discrete nonvolatile memory region, and/or more than one continuous or discrete high voltage regions. Where the integrated circuit comprises more than one discrete nonvolatile memory regions, the integrated circuit may still comprise one or more continuous or discrete high voltage regions immediately adjacent to at least one outermost border of each nonvolatile memory region.

Preferably, the total CMOS region area of the integrated circuit comprises at least 40% of the integrated circuit, more preferably at least 50%, even more preferably from 60 to 99% and most preferably from 65 to 90% of the integrated circuit. Preferably, the total nonvolatile memory region area of the integrated circuit comprises no more than 50% of the integrated circuit, more preferably less than 50%, even more preferably from 1 to 30%, and most preferably from 10 to 25% of the integrated circuit. In one embodiment, the nonvolatile region consumes between 15 and 20% of the integrated circuit area. The high voltage region generally comprises the balance of the area of the integrated circuit area, preferably at least 1%, more preferably at least 3%, and even more preferably from 3% to 20% of the area of the integrated circuit.

What is claimed is:

1. An electrically erasable and programmable read-only memory cell comprising:
   a tunnel dielectric layer formed on a silicon substrate;
   a non-volatile storage transistor including (i) a floating gate on said tunnel dielectric layer, said floating gate having vertical sidewalls, (ii) an interlayer dielectric layer thereon and (iii) a control gate in contact with said interlayer dielectric layer and said tunnel dielectric layer; and
   a select transistor including a gate on a gate oxide layer, a protective dielectric layer thereon and a sidewall spacer adjacent to said select transistor gate, said protective dielectric layer and said gate oxide layer, said gate of said select transistor and said gates of said non-volatile storage transistor overlapping a common source/drain implant region in said substrate;
   wherein said control gate overlaps essentially all of the vertical sidewalls of said floating gate.

2. The memory cell according to claim 1, wherein said select transistor gate and said control gate are the same material.

3. The memory cell according to claim 1, wherein said select transistor gate and said control gate have substantially the same thickness.

4. The memory cell according to claim 1, wherein said select transistor gate and said floating gate are the same material.

5. The memory cell according to claim 1, wherein said select transistor gate and said floating gate have substantially the same thickness.

6. The memory cell according to claim 1, wherein said tunnel dielectric layer is thinner than said gate oxide layer.

7. The memory cell according to claim 1, wherein said gate oxide layer and said tunnel dielectric layer are the same material.

8. The memory cell according to claim 1, further comprising a contact adjacent to said sidewall spacer.

9. An electrically erasable and programmable read-only memory cell comprising:

a tunnel dielectric layer formed on a silicon substrate;

a non-volatile storage transistor including (i) a floating gate on said tunnel dielectric layer, (ii) a dielectric material thereon and (iii) a control gate in contact with said dielectric material and said tunnel dielectric layer;

a select transistor including a gate on said tunnel dielectric layer;

a first source/drain implant region in said substrate including a first lightly doped diffusion region overlapping said select transistor gate;

a buried implant region in said substrate including a second lightly doped diffusion region overlapping said select transistor gate and a directional implant region overlapping said floating gate; and a second source/drain implant region having (i) a moderately doped region overlapping said floating gate and said control gate and (ii) a heavily doped second region aligned with or overlapped by said control gate.

10. The memory cell according to claim 9, further comprising:

a pair of CMOS transistors, each comprising a gate having a thickness substantially the same as one of said floating gate and said gate of said select transistor.

11. The memory cell according to claim 10, further comprising a first high-voltage transistor.

12. The memory cell according to claim 11, further comprising a second high-voltage transistor.

13. The memory cell according to claim 9, further comprising a plurality of sidewall spacers adjacent to a gate of at least one transistor.

14. The memory cell according to claim 10, wherein said gates of said CMOS transistors have a thickness identical to one of said select transistor or said storage transistor.

15. An integrated circuit comprising:

a tunnel dielectric layer formed on a silicon substrate;

a non-volatile storage transistor including (i) a floating gate on said tunnel dielectric layer, (ii) a dielectric material thereon and (iii) a control gate in contact with said dielectric material and said tunnel dielectric layer;

a select transistor including a gate on said tunnel dielectric layer, said gate of said select transistor and said floating gate sharing a common source/drain implant region in said substrate; and first and second CMOS transistors, each comprising a gate having a thickness substantially the same as said floating gate or said gate of said select transistor.

16. The integrated circuit according to claim 15, further comprising a first high-voltage transistor.

17. The integrated circuit according to claim 15, further comprising a second high-voltage transistor.

18. The integrated circuit according to claim 15, further comprising a plurality of sidewall spacers adjacent to a gate of at least one transistor.

19. The integrated circuit according to claim 15, wherein said gates of said CMOS transistors have a thickness identical to that of said select transistor gate or one of said storage transistor gates.

* * * * *